United States Patent
Kim et al.

(10) Patent No.: US 8,130,508 B2
(45) Date of Patent: Mar. 6, 2012

(54) ELECTRONIC COMPONENT EMBEDDED PRINTED CIRCUIT BOARD AND MANUFACTURING METHOD THEREOF

(75) Inventors: Woon-Chun Kim, Suwon-si (KR); Soon-Gyu Yim, Seongnam-si (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 358 days.

(21) Appl. No.: 12/416,472

(22) Filed: Apr. 1, 2009

(65) Prior Publication Data
US 2010/0101847 A1  Apr. 29, 2010

(30) Foreign Application Priority Data
Oct. 28, 2008  (KR) .................. 10-2008-0105777

(51) Int. Cl.
*H05K 1/14*  (2006.01)
(52) U.S. Cl. ........................................ 361/763
(58) Field of Classification Search .......... 361/763–784, 361/803; 257/728–730, 690–692; 174/259–264
See application file for complete search history.

(56) References Cited

U.S. PATENT DOCUMENTS

| | | | |
|---|---|---|---|
| 5,886,877 A | * | 3/1999 | Shingai et al. ............ 361/768 |
| 2008/0106879 A1 | * | 5/2008 | Ryu et al. ............ 361/783 |

* cited by examiner

*Primary Examiner* — Phuong Dinh
(74) *Attorney, Agent, or Firm* — McDermott Will & Emery LLP

(57) ABSTRACT

A printed circuit board with an electronic component embedded printed circuit board and a manufacturing method thereof are disclosed. According to an embodiment of the present invention, the method of manufacturing a printed circuit board with an embedded electronic component having a groove formed on one surface thereof and an electrode formed inside the groove includes: forming a first circuit pattern on one surface of a first metal layer; pressing the first metal layer against a first insulator; forming a first conductive protrusion by selectively etching the other surface of the first metal layer; and mounting a first electronic component by disposing a conductive adhesive layer such that an electrode of the first electronic component and the first conductive protrusion are electrically connected to each other. Thus, an electronic component without its electrode protruded outward can be mounted easily and reliably and the manufacturing time can be shortened.

3 Claims, 22 Drawing Sheets

10

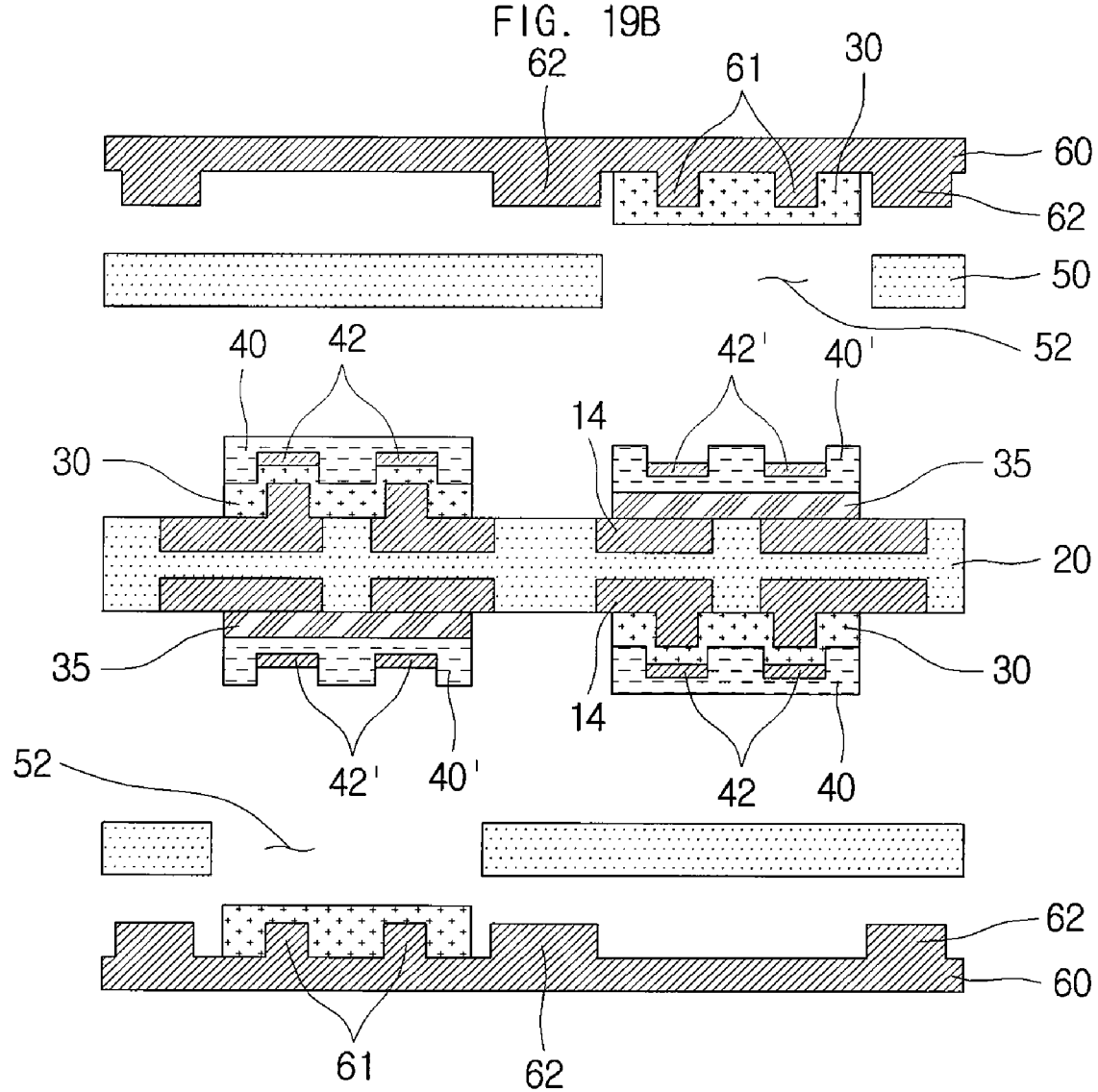

ELECTRONIC COMPONENT EMBEDDED PRINTED CIRCUIT BOARD AND MANUFACTURING METHOD THEREOF

CROSS-REFERENCE TO RELATED APPLICATIONS

This application claims the benefit of Korean Patent Application No. 10-2008-0105777, filed with the Korean Intellectual Property Office on Oct. 28, 2008, the disclosure of which is incorporated herein by reference in its entirety.

BACKGROUND

1. Technical Field

The present invention relates to an electronic component embedded printed circuit board and a manufacturing method thereof.

2. Description of the Related Art

In step with the rapidly-changing information age, there has been an evolution of technologies in electronic component embedded printed circuit boards, in which various active components are not mounted on a surface of the printed circuit board but mounted inside the board, to provide more features in a small space. As more active components are increasingly embedded in the board, various functions of the various active components can be implemented and the lining of signaling can be minimized, thanks to the extra surface obtained.

As such, in case the active components are embedded inside the board, a via has to be formed in the board such that the active components are electrically connected to circuit patterns.

In order to form the via, a hole may be formed in the board by using a laser, and then a plating layer may be formed inside the hole. However, while forming the hole, it is possible to damage an electrode of the electronic component due to undercuts caused by the laser, thereby increasing the plating process and time to plate.

SUMMARY

The present invention provides an electronic component embedded printed circuit board and a manufacturing method thereof, in which an electronic component without its electrode protruded outward can be mounted easily and reliably and the manufacturing time can be shortened.

An aspect of the present invention provides a method of manufacturing a printed circuit board. In accordance with an embodiment of the present invention, the method of manufacturing a printed circuit board with an embedded electronic component having a groove formed on one surface thereof and an electrode formed inside the groove includes: forming a first circuit pattern on one surface of a first metal layer; pressing the first metal layer against a first insulator; forming a first conductive protrusion by selectively etching the other surface of the first metal layer; and mounting a first electronic component by disposing a conductive adhesive layer such that an electrode of the first electronic component and the first conductive protrusion are electrically connected to each other.

The pressing of the first metal layer, the forming of the first conductive protrusion and the mounting of the first electronic component can be performed for both surfaces of the first insulator.

The method can further include: forming a second circuit pattern on one surface of a second metal layer; pressing the second metal layer against the first insulator by disposing a second insulator; and forming a third circuit pattern by selectively etching the other surface of the second metal layer.

Before the pressing of the second metal layer, the method can further include: forming a nonconductive adhesive layer on one surface of the first insulator; and adhering a second electronic component to the nonconductive adhesive layer such that an electrode of the second electronic component does not face the first insulator, in which a through-hole corresponding to the second electronic component can be formed in the second insulator; a second conductive protrusion corresponding to the electrode of the second electronic component can be formed on one surface of the second metal layer; and a conductive adhesive layer can be formed between the electrode of the second electronic component and the second conductive protrusion.

Another aspect of the present invention provides a printed circuit board. In accordance with an embodiment of the present invention, the printed circuit board with an embedded electronic component having a groove formed on one surface thereof and an electrode formed inside the groove includes: a first insulator; a first circuit pattern, which is buried in one surface of the first insulator; a first conductive protrusion, which is formed on the first circuit pattern; and a first electronic component, which is mounted on the first insulator by disposing a conductive adhesive layer and in which an electrode of the first electronic component is electrically connected to the first conductive protrusion through the conductive adhesive layer.

The first circuit pattern, the first conductive protrusion and the first electronic component can be formed on both surfaces of the first insulator.

The printed circuit board can further include: a second insulator, which is stacked on the first insulator such that the first electronic component is covered; a second circuit pattern, which is buried in one surface of the second insulator; and a third circuit pattern, which is formed on one surface of the second insulator and in which the third circuit pattern is protruded outwards.

The printed circuit board can further include: a second electronic component, which is adhered to one surface of the first insulator by disposing a nonconductive adhesive layer such that an electrode of the second electronic component does not face the first insulator; a second conductive adhesive layer, which is formed on the electrode of the second electronic component; and a second conductive protrusion, which is buried in the second conductive adhesive layer such that the electrode of the second electronic component is electrically connected to the second conductive protrusion.

Additional aspects and advantages of the present invention will be set forth in part in the description which follows, and in part will be obvious from the description, or may be learned by practice of the invention.

DETAILED DESCRIPTION

Figure 1:
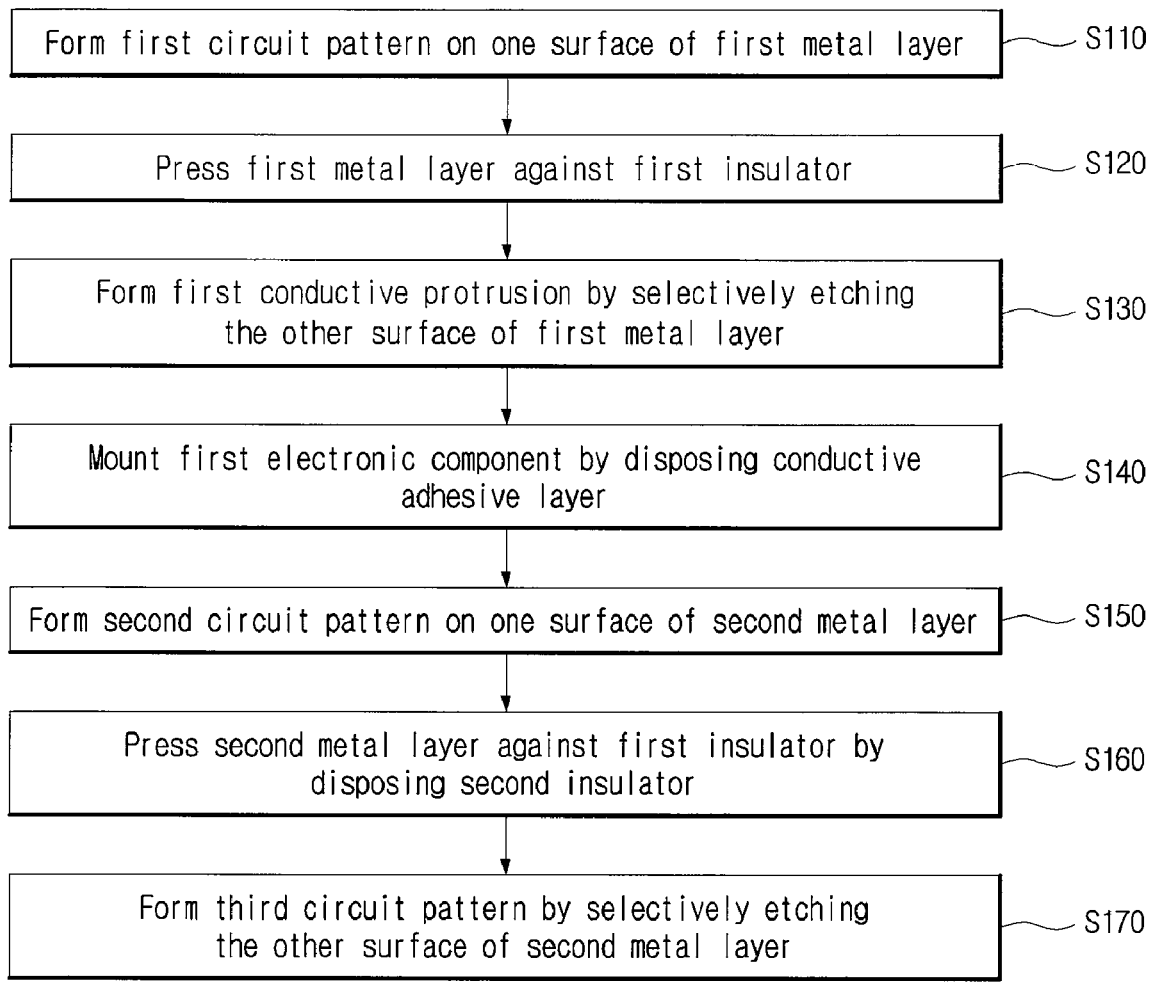
FIG. 1 is a flowchart illustrating a method of manufacturing an electronic component embedded printed circuit board in accordance with an embodiment of the present invention.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention.

An electronic component embedded printed circuit board and a manufacturing method thereof in accordance with certain embodiments of the present invention will be described below in more detail with reference to the accompanying drawings. Those components that are the same or are in correspondence are rendered the same reference numeral regardless of the figure number, and redundant explanations are omitted.

First of all, a method of manufacturing an electronic component embedded printed circuit board in accordance with an embodiment of the present invention will be described with reference to FIGS. 1 to 13.

FIG. 1 is a flowchart illustrating a method of manufacturing an electronic component embedded printed circuit board in accordance with an embodiment of the present invention, and FIGS. 2 to 13 are flow diagrams illustrating a process of manufacturing an electronic component embedded printed circuit board in accordance with an embodiment of the present invention. Illustrated in FIGS. 2 to 13 are a first metal layer 10, a plating resist 12, an etching resist 13, a first circuit pattern 14, a first conductive protrusion 16, a first insulator 20, a conductive adhesive layer 30, a first electronic component 40, an electrode 42, a second insulator 50, a through-hole 52, a second metal layer 60, a second conductive protrusion 61, a second circuit pattern 62 and a third circuit pattern 64.

Figure 2:
FIGS. 2 to 13 are flow diagrams illustrating a method of manufacturing an electronic component embedded printed circuit board in accordance with an embodiment of the present invention.
Figure 3:
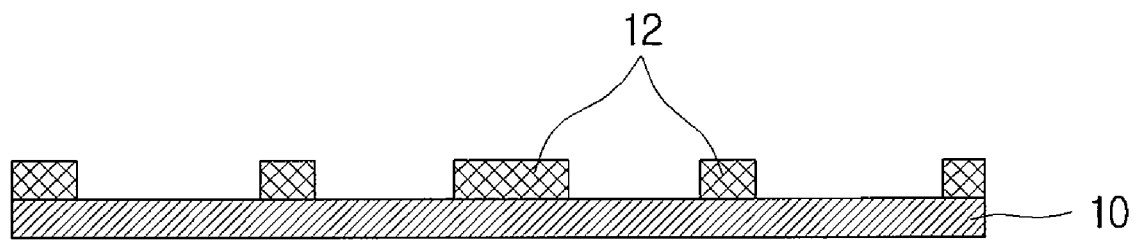
Figure 4:
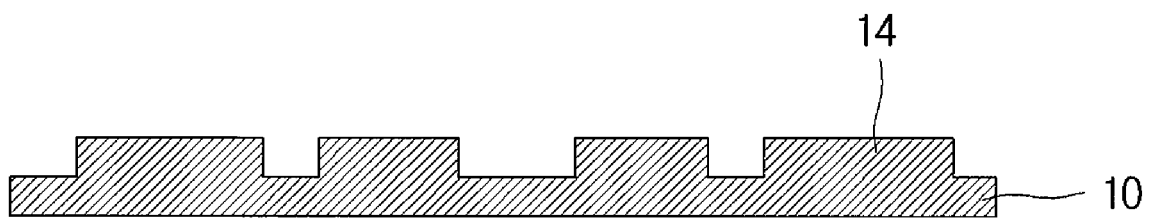

The first circuit pattern 14 is formed on one surface of the first metal layer 10 (S110). To do this, the first metal layer 10 having a desired thickness is prepared, as illustrated in FIG. 2, and the plating resist 12 is formed on an upper surface of the first metal layer 10 and then a plating process can be performed, as illustrated in FIG. 3. Through these processes, the first circuit 14 can be formed on one surface of the first metal layer 10, as illustrated in FIG. 4.

After these processes, the first metal layer 10 is pressed against the first insulator 20 (S120). Here, the first metal layer 10 can be pressed against both surfaces of the first insulator 20 at the same time, taking an efficient way of manufacturing the printed circuit board and the warpage of the board into consideration. To do this, it shall be evident that the above processes illustrated in FIGS. 2 to 4 can be repeated.

Figure 5:
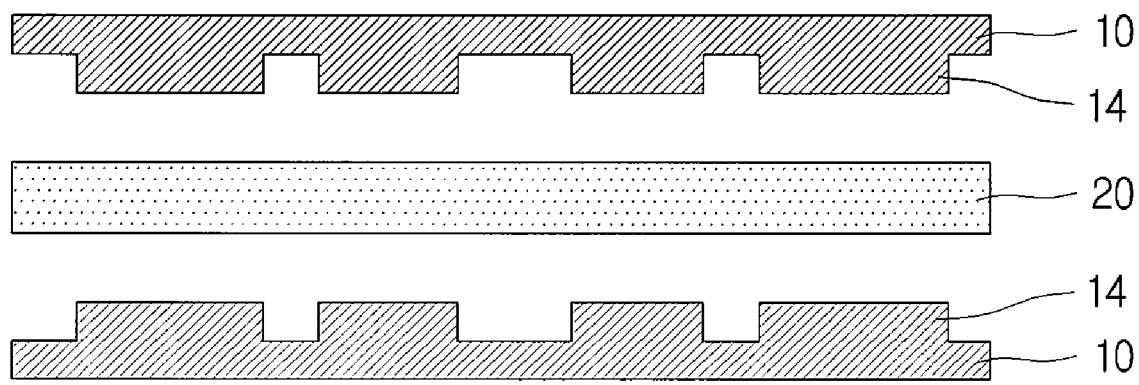
Figure 6:
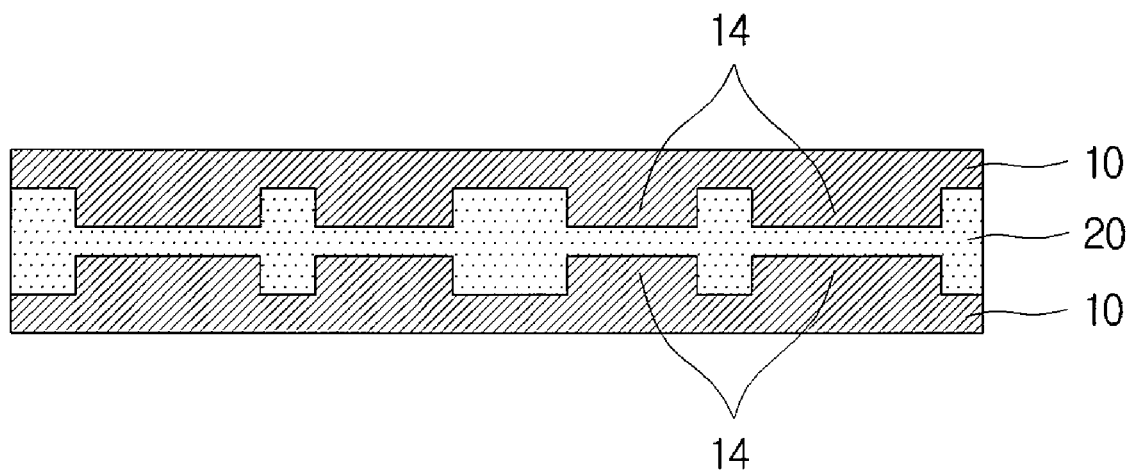

In other words, the first metal layer 10 having the first circuit pattern 14 formed therein is prepared in a group of two, and the first metal layer 10 is arranged parallel to both the upper and lower surfaces of the first insulator 20, as illustrated in FIG. 5, and then compressed at the same time, as illustrated in FIG. 6. Through these processes, the first circuit pattern 14 formed on the first metal layer 10 is buried in the first insulator 20.

Next, the first conductive protrusion 16 is formed by selectively etching the other surface of the first metal layer 10 (S130). The first conductive protrusion 16, on which the first electronic component 40 will be mounted later, is a part to which the electrode 42 of the first electronic component 40 is electrically connected. Therefore, the number of protrusions 16 can be changed, taking the number of electronic components 40 being mounted and the number of electrodes 42 being formed in the corresponding electronic component 40 into consideration.

Figure 7:
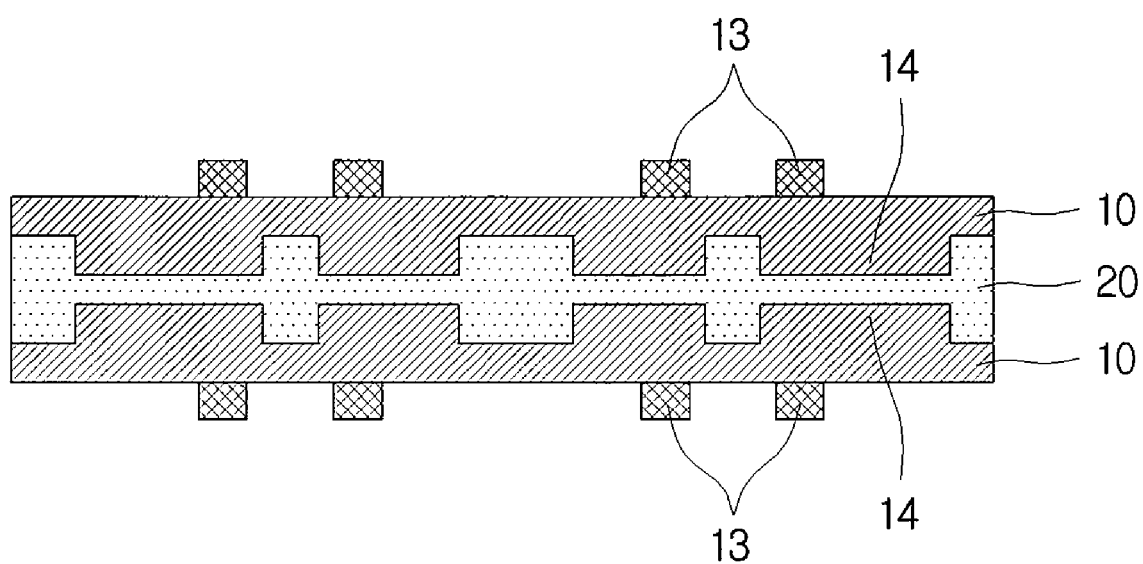
Figure 8:
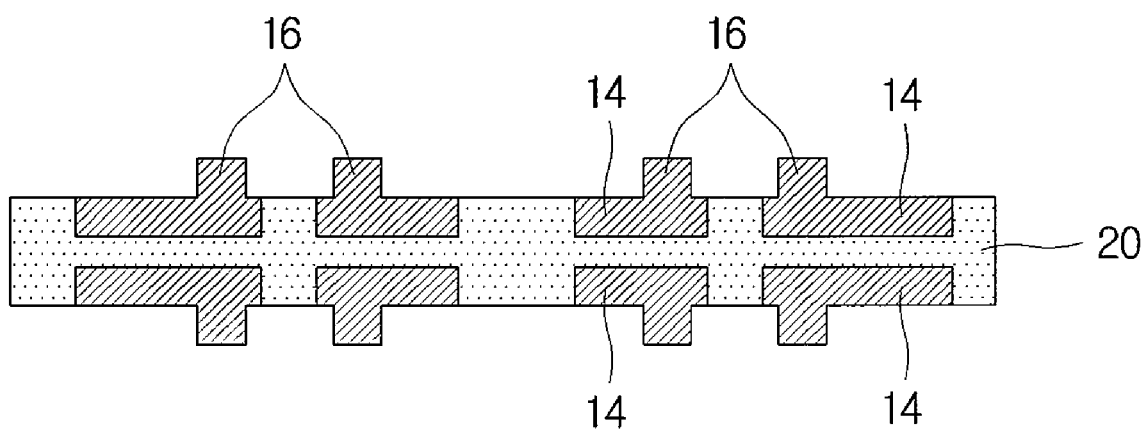

To do this, as illustrated in FIG. 7, the etching resist 13 corresponding to the first conductive protrusion 16 is formed on the upper surface of the first metal layer 10, which is selectively removed by applying an etching liquid, and then the etching resist 13 can be removed. Through these processes, the first conductive protrusion 16 can be formed, as illustrated in FIG. 8.

In the case of using the method described above, the first circuit pattern 14 and the first conductive protrusion 16 can be electrically connected to each other without performing another process.

Figure 9:
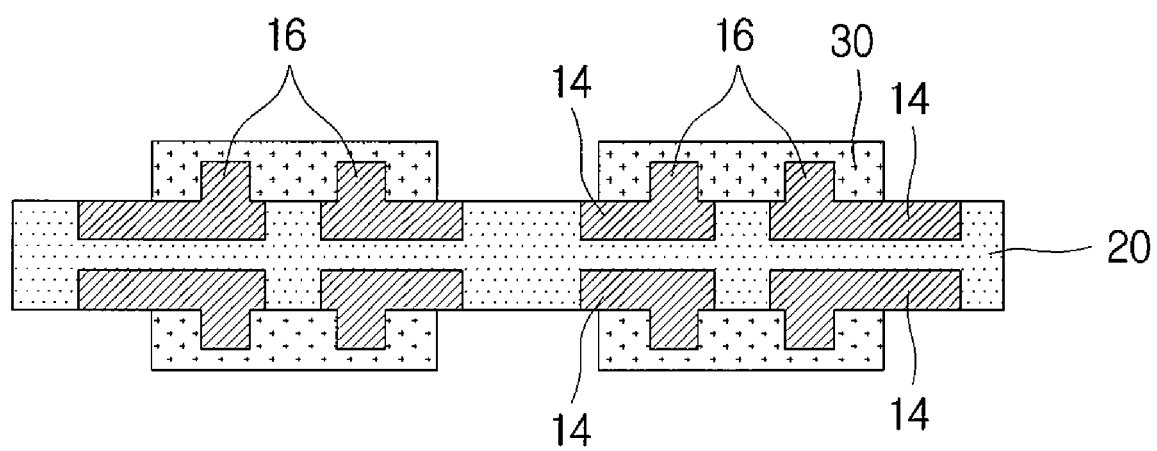

Next, the first electronic component 40 is mounted by disposing the conductive adhesive layer 30, such that the electrode 42 of the first electronic component 40 and the first conductive protrusion 16 are electrically connected to each other (S140). To do this, the conductive adhesive layer 30 is formed on an upper surface of the first conductive protrusion 16 by using ACF or ACP, as illustrated in FIG. 9, and then the first electronic component 40 is mounted on the conductive adhesive layer 30, as illustrated in FIG. 10.

Figure 10:
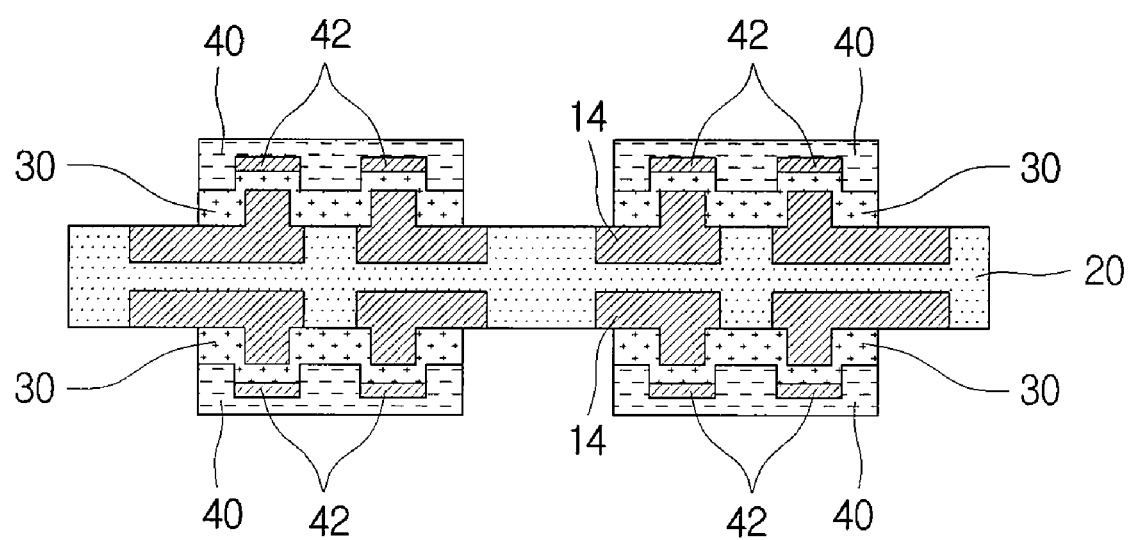

In the case of a structure in which the electrode 42 is formed inside a groove of the electronic component 40, as illustrated in FIG. 10, a portion of the first conductive protrusion 16 can be inserted in the groove, and thus a reliability issue in the attachment of the first conductive protrusion 16 and the electrode 42 through the conductive adhesive layer 30 can be solved. Moreover, the electronic component 40 can be strongly supported by the first conductive protrusion 16 due to this structural configuration.

It shall be apparent that the process of mounting the electronic component 40, which has been described above, can be performed on both surfaces of the first insulator 20.

Illustrated in FIG. 10 is a pair of the electronic components 40 mounted on one surface of the first insulator 20. However, it shall be apparent that the number of electronic components being mounted on the first insulator 20 can be changed, depending on the design specifications. In this case, the number of first conductive protrusions 16 can be also changed, as described above.

Figure 11:
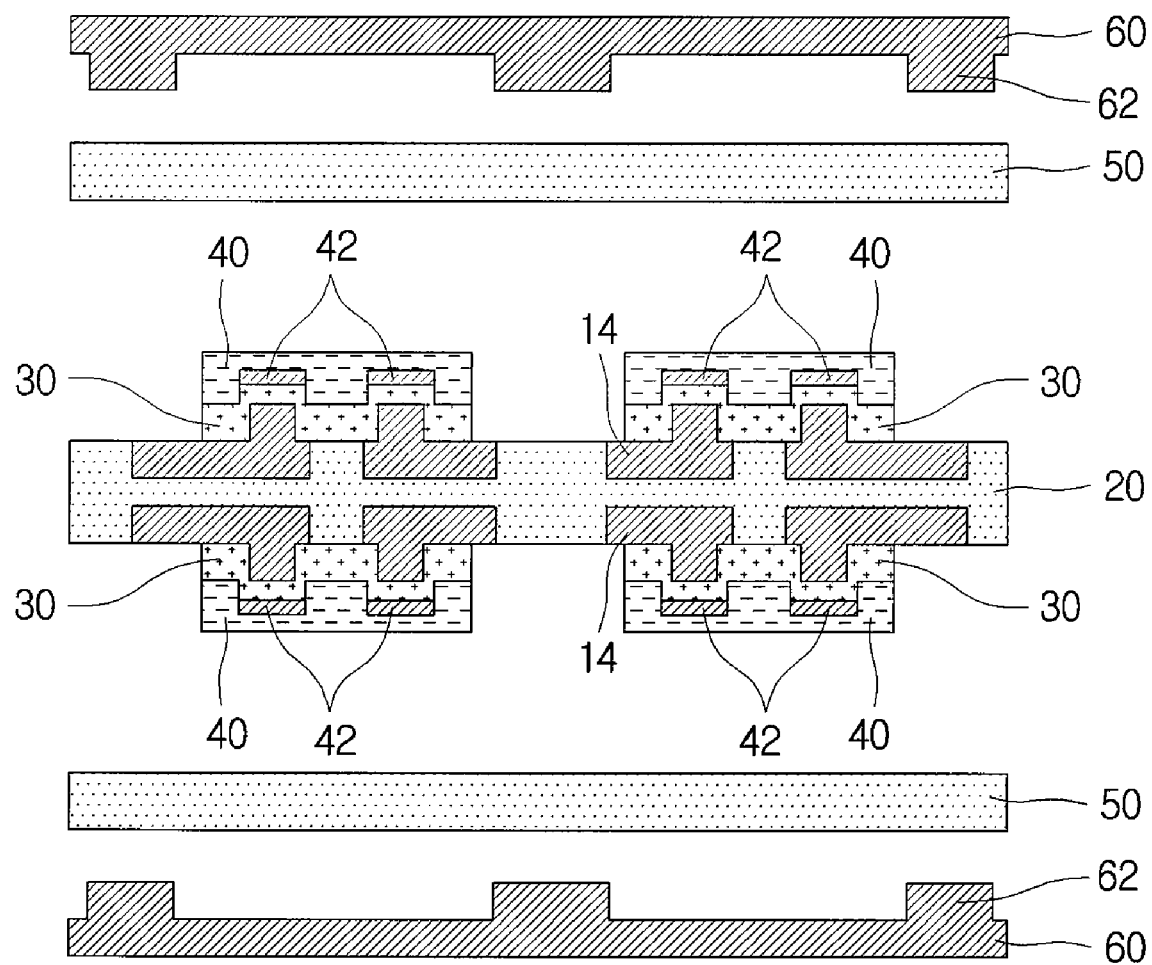
Figure 12:
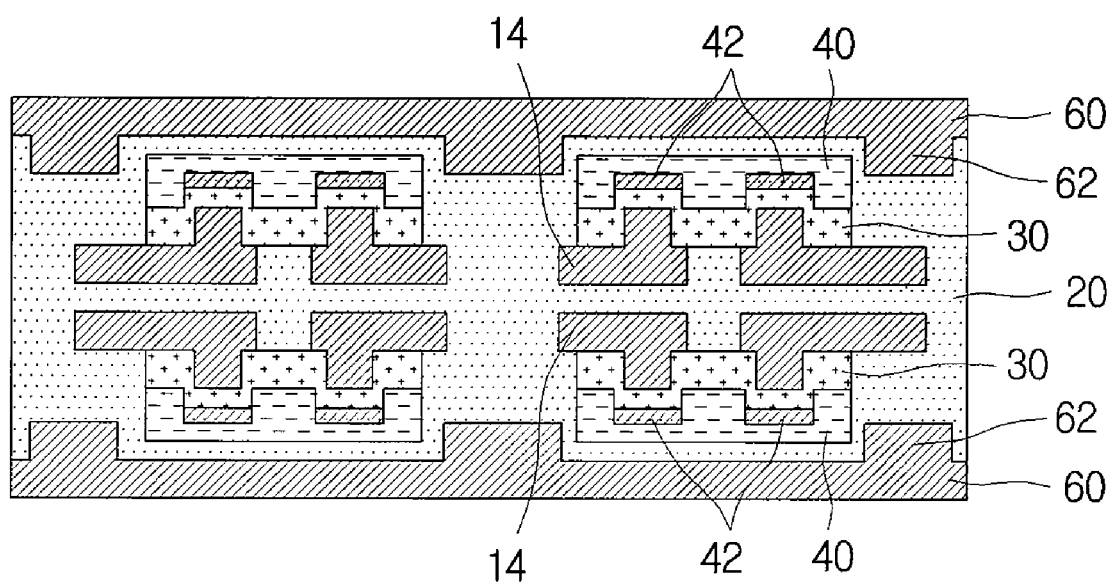

After the above processes, the second circuit pattern 62 is formed on one surface of the second metal layer 60, as illustrated in FIG. 11 (S150), and the second metal layer 60 is pressed against the first insulator 20 by disposing the second insulator 50, as illustrated in FIG. 12 (S160). Then, the third circuit pattern 64 can be formed by selectively etching the other surface of the second metal layer 60, as illustrated in FIG. 13 (S170).

Especially to form the second circuit pattern 62 on one surface of the second metal layer 60, the same method illustrated in FIGS. 2 to 4 can be used. In order to form the third circuit pattern 64, the method illustrated in FIGS. 7 and 8 can be used. If the above methods are used, the second circuit pattern 62 and the third circuit pattern 64 can be electrically connected to each other without performing any further process.

Figure 13:
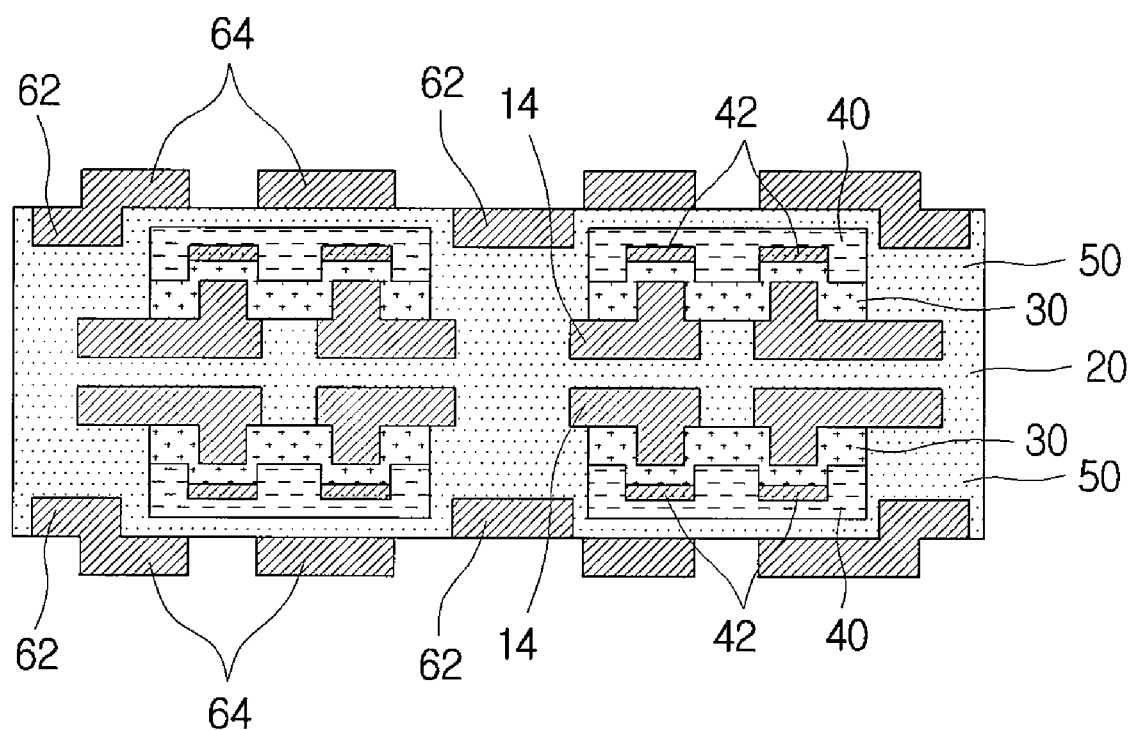

Illustrated in FIG. 13 is the electronic component embedded printed circuit board manufactured through the above processes. The electronic component embedded printed circuit board in accordance with an embodiment of the present invention includes the first insulator 20, in which the first circuit pattern 14 is embedded in one surface of the first insulator 20, and the first conductive protrusion 16, which is formed on the first circuit pattern 14 and electrically connected to the electrode 42 formed inside the groove of the first electronic component 40 through the conductive adhesive layer 30.

The second insulator 50 is stacked on the first insulator 20 to cover the first electronic component 40. Then, the second circuit pattern 62 is buried in the second insulator 50, and the third circuit pattern 64, which is protruded outward, is formed, thereby implementing a multilayered structure.

Next, a method of manufacturing an electronic component embedded printed circuit board in accordance with another embodiment of the present invention will be described with reference to FIGS. 14 to 21, which are flow diagrams illustrating a process of manufacturing the electronic component embedded printed circuit board in accordance with another embodiment of the present invention. Illustrated in FIGS. 14 to 21 are the first metal layer 10, the plating resist 12, the etching resist 13, the first circuit pattern 14, the first conductive protrusion 16, the first insulator 20, the conductive adhesive layer 30, a nonconductive adhesive layer 35, the first electronic component 40, a second electronic component 40', the electrode 42, an electrode 42', the second insulator 50, the through-hole 52, the second metal layer 60, the second conductive protrusion 61, the second circuit pattern 62 and the third circuit pattern 64.

Compared to the previously described embodiment of the present invention, the method of manufacturing an electronic component embedded printed circuit board in accordance with the present embodiment is different in that the electrodes 42 and 42' of the electronic components 40 and 42' being mounted on one surface of the first insulator 10 have different directions. Thus, certain detailed description of the described embodiments will be omitted, when it is repeated, and the difference will be mainly described herein.

Figure 14:
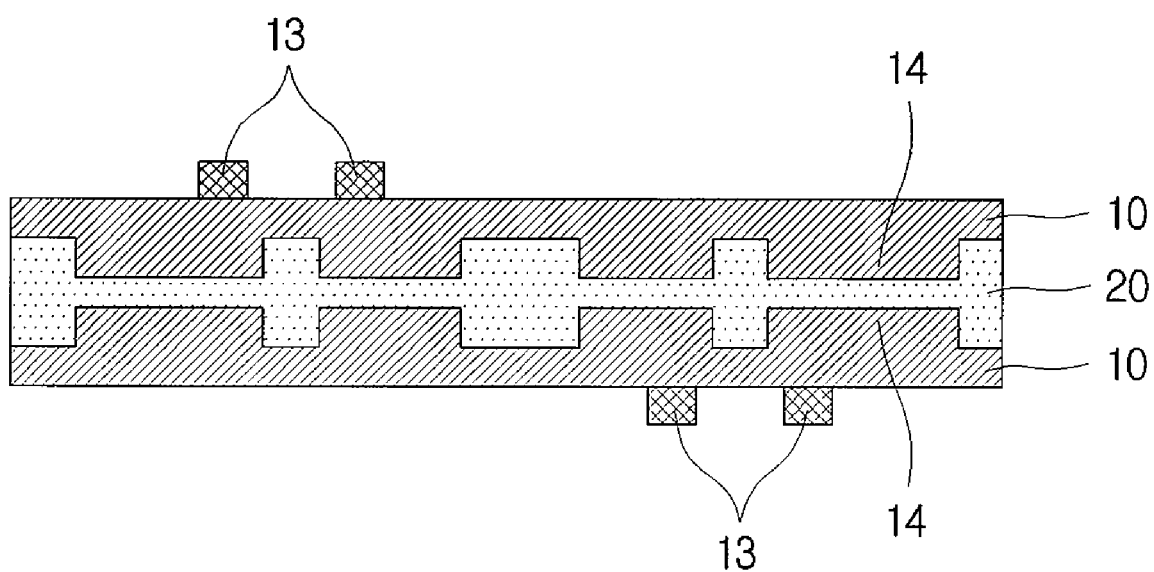
FIGS. 14 to 21 are flow diagrams illustrating a method of manufacturing an electronic component embedded printed circuit board in accordance with another embodiment of the present invention.
Figure 15:
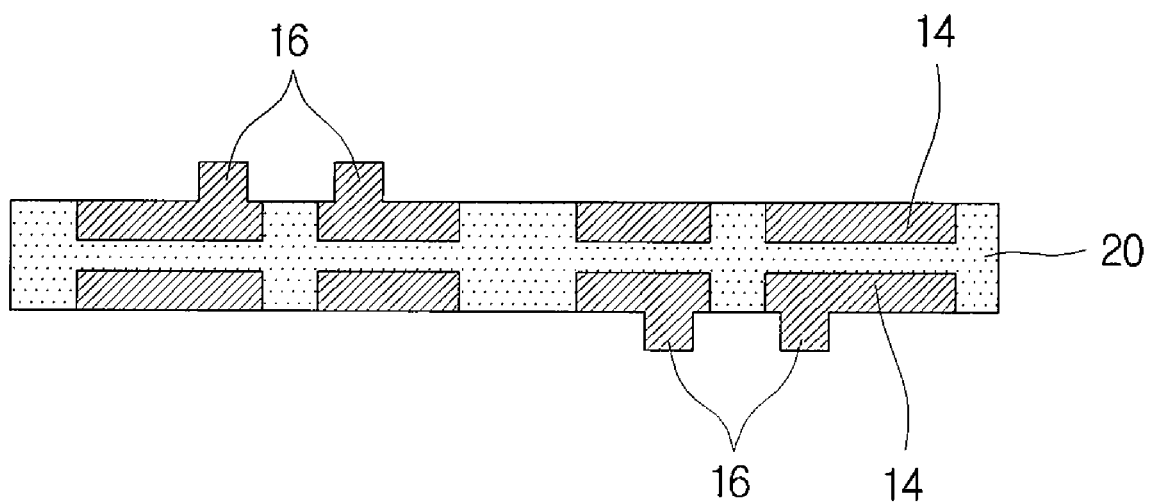

First, the first metal layer 10 having the first circuit pattern 14 formed therein is pressed against both surfaces of the first insulator 20 by using the same method described in FIGS. 2 to 6. After that, the etching resist 13 is formed on the first metal layer 10, as illustrated in FIG. 14, and then the first conductive protrusion 16 is formed by applying the etching liquid, as illustrated in FIG. 15.

Figure 16:
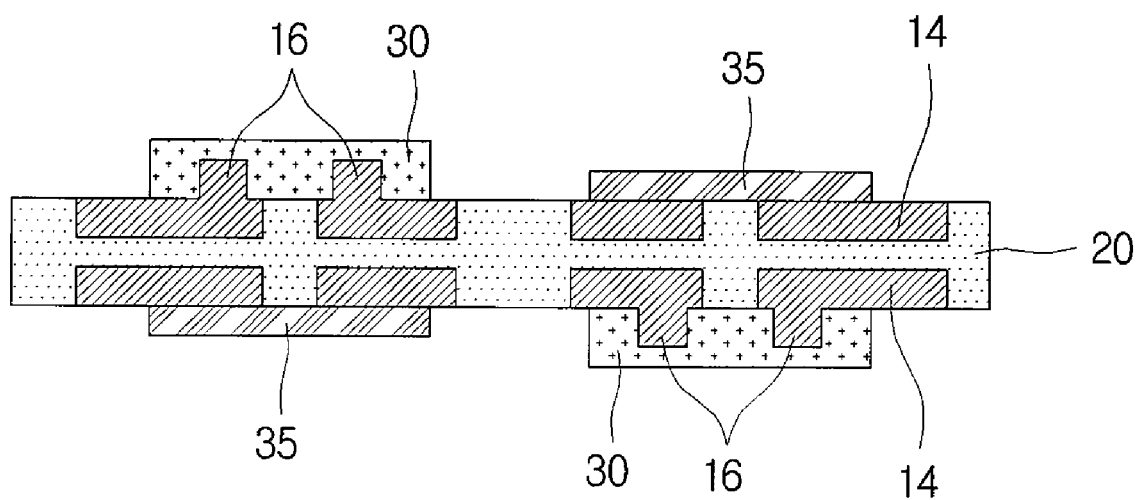

After these processes, as illustrated in FIG. 16, the nonconductive adhesive layer 35 is formed by using NCF or NCP on one surface of the first insulator 20 where the first conductive protrusion 16 is not formed. Likewise, the conductive adhesive layer 30 is formed by using ACF or ACP on the upper surface of the first conductive protrusion 16.

Figure 17:
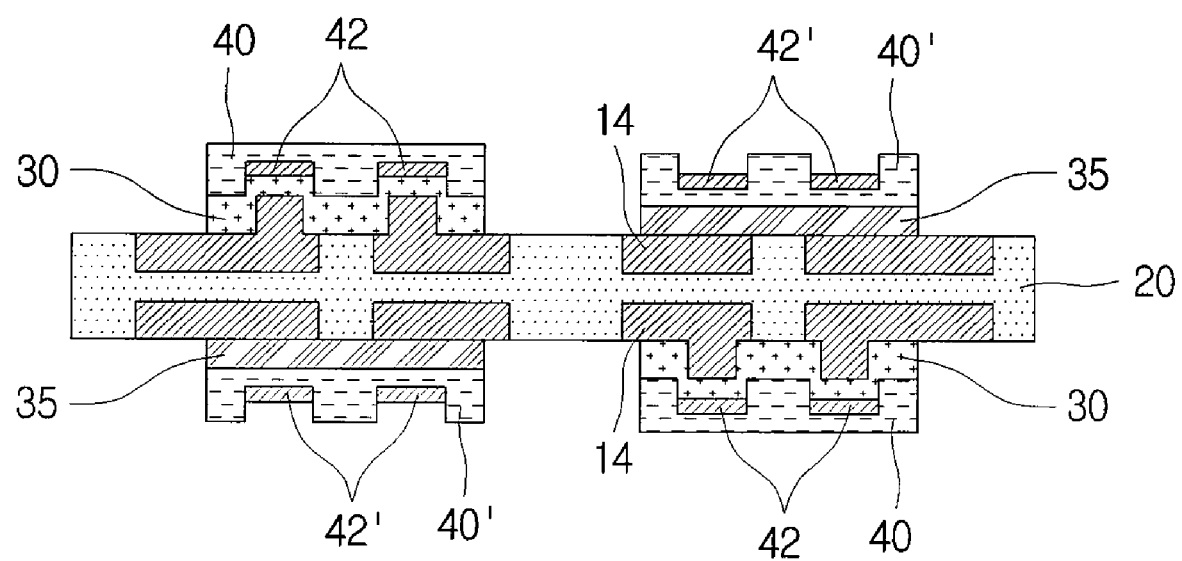

Then, as illustrated in FIG. 17, the second electronic component 40' is coupled to the nonconductive adhesive layer 35 such that the electrode 42' does not face the first insulator 20. That is, a surface, on which the electrode 42' is not formed, of the second electronic component 40' is coupled to the nonconductive adhesive layer 35. Likewise, the first electronic component 40 is mounted on the upper surface of the first conductive protrusion 16, on which the conductive adhesive layer 30 is formed.

Figure 18:
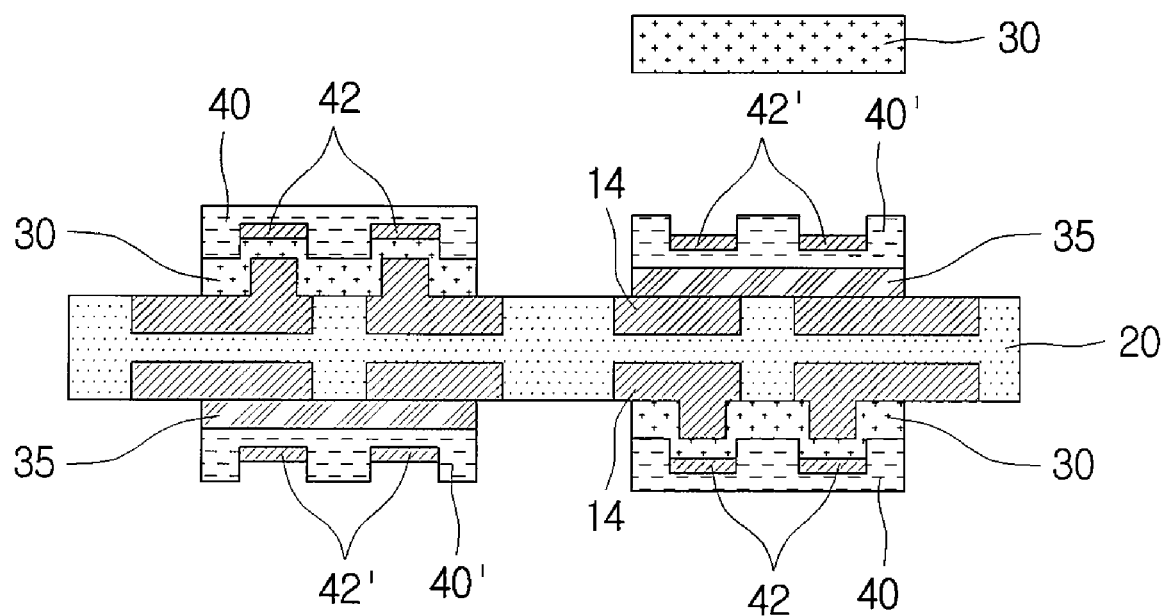
Figure 19A:
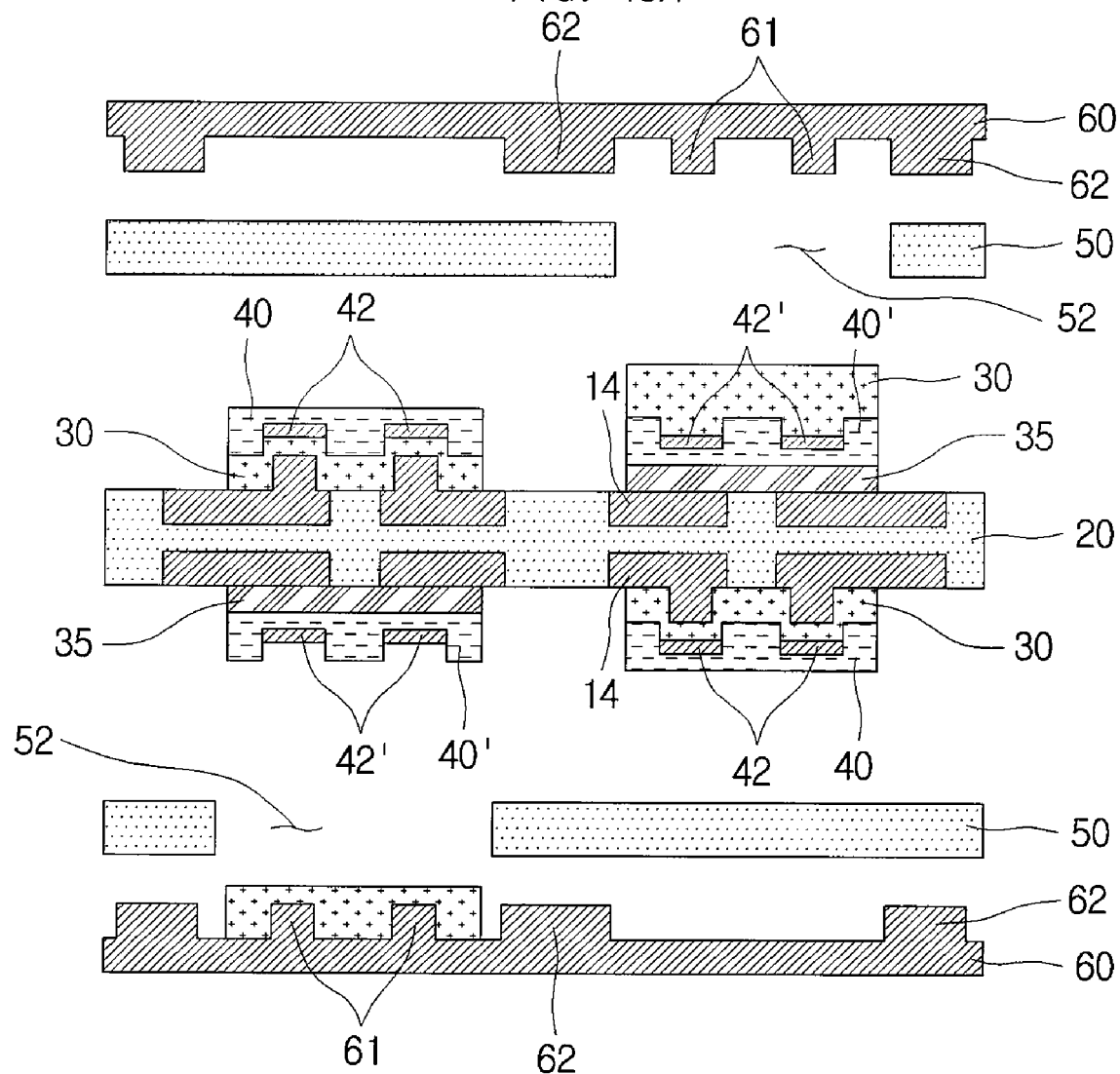
Figure 20:
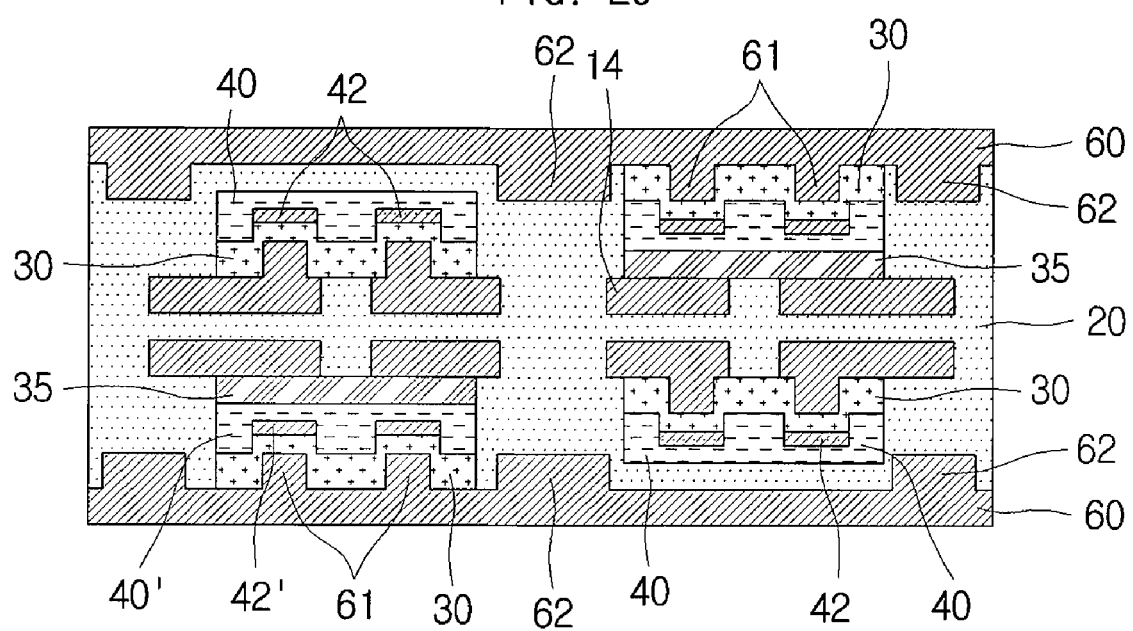

After that, the conductive adhesive layer 30 is formed by using ACF or ACP on an upper surface of the second electronic component 40', as illustrated in FIG. 18. Then, as illustrated in FIG. 19A, the second metal layer 60 having the second circuit pattern 62 and the second conductive protrusion 61 formed on one surface thereof is pressed against the first insulator 20 by disposing the second insulator 50, in which the through-hole 52 corresponding to the second electronic component 40' is formed (in FIG. 20).

Here, the second metal layer 60 can be pressed after forming the conductive adhesive layer 30 on the second conductive protrusion 61, as illustrated in FIG. 19B.

Figure 21:
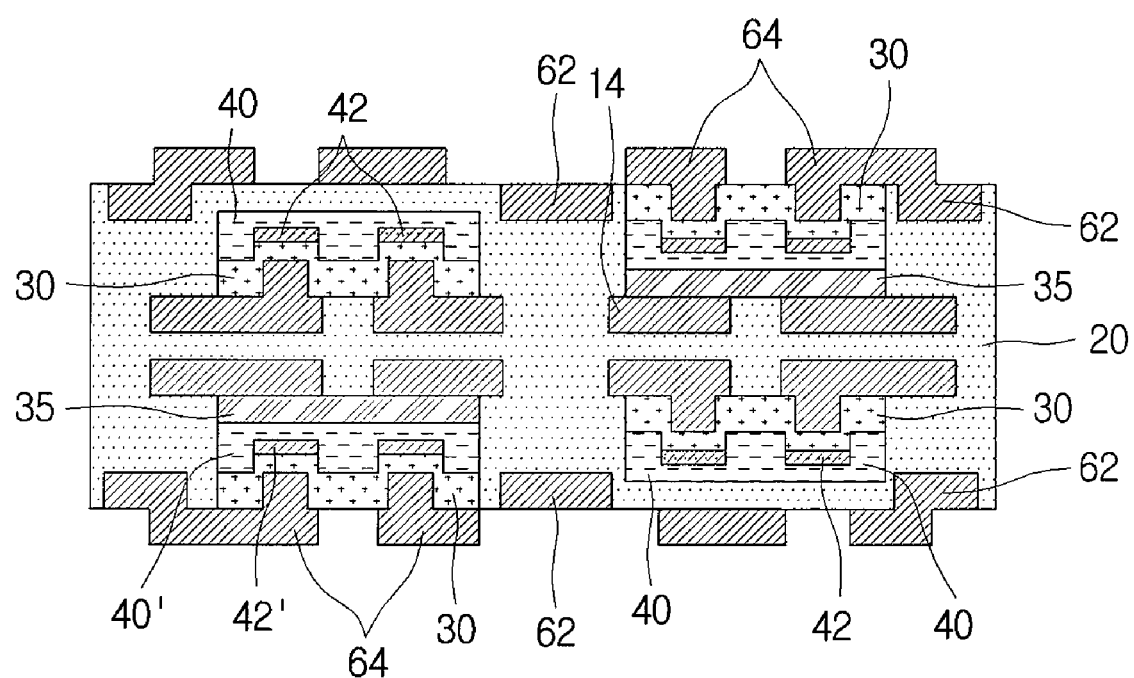

After that, the third circuit pattern 64 is formed by selectively etching the other surface of the second metal layer 60, as illustrated in FIG. 21.

Illustrated in FIG. 21 is the electronic component embedded printed circuit board manufactured through the above processes. Not only does the electronic component embedded printed circuit in accordance with the present embodiment have the advantages of the electronic component embedded printed circuit in accordance with the previously described embodiment, but it also has the advantage of effectively using both surfaces of the printed circuit board by disposing some of the electronic components such that the electrode 42' faces upward and by disposing the others such that the electrode 42 faces downward.

While the spirit of the invention has been described in detail with reference to particular embodiments, the embodiments are for illustrative purposes only and shall not limit the invention. It is to be appreciated that those skilled in the art can change or modify the embodiments without departing from the scope and spirit of the invention. As such, many embodiments other than those set forth above can be found in the appended claims.

What is claimed is:

1. A printed circuit board with an embedded electronic component having a groove formed on one surface thereof and an electrode formed inside the groove, the printed circuit board comprising:
    a first insulator;
    a first circuit pattern buried in one surface of the first insulator;
    a first conductive protrusion disposed on the first circuit pattern;
    a first electronic component mounted on the first insulator by disposing a conductive adhesive layer, wherein an electrode of the first electronic component is electrically connected to the first conductive protrusion through the conductive adhesive layer;
    a second insulator stacked on the first insulator such that the first electronic component is covered;
    a second circuit pattern buried in one surface of the second insulator; and
    a third circuit pattern disposed on one surface of the second insulator, the third circuit pattern protruding outwards.

2. The printed circuit board of claim 1, wherein the first circuit pattern, the first conductive protrusion and the first electronic component are formed on both surfaces of the first insulator.

3. The printed circuit board of claim 1, further comprising:
    a second electronic component adhered to one surface of the first insulator by disposing a nonconductive adhesive layer such that an electrode of the second electronic component does not face the first insulator;
    a second conductive adhesive layer formed on the electrode of the second electronic component; and
    a second conductive protrusion buried in the second conductive adhesive layer such that the electrode of the second electronic component is electrically connected to the second conductive protrusion.

* * * * *